US012690428B2

(12) United States Patent
Mazzamuto et al.

(10) Patent No.: US 12,690,428 B2
(45) Date of Patent: Jul. 21, 2026

(54) METHOD OF PREPARING A SILICON CARBIDE WAFER

(71) Applicant: Oxford Instruments Nanotechnology Tools Limited, High Wycombe (GB)

(72) Inventors: Samantha Mazzamuto, Abingdon (GB); Andrew Newton, Abingdon (GB); Matthew Loveday, Abingdon (GB); Michael Cooke, Abingdon (GB)

(73) Assignee: Oxford Instruments Nanotechnology Tools Limited, High Wycombe (GB)

(*) Notice: Subject to any disclaimer, the term of this patent is extended or adjusted under 35 U.S.C. 154(b) by 230 days.

(21) Appl. No.: 18/027,071

(22) PCT Filed: Sep. 17, 2021

(86) PCT No.: PCT/GB2021/052423
§ 371 (c)(1),
(2) Date: Mar. 17, 2023

(87) PCT Pub. No.: WO2022/058743
PCT Pub. Date: Mar. 24, 2022

(65) Prior Publication Data
US 2023/0326735 A1     Oct. 12, 2023

(30) Foreign Application Priority Data

Sep. 18, 2020   (GB) ...................................... 2014733

(51) Int. Cl.
*H10P 90/00*        (2026.01)
*H10P 50/24*        (2026.01)

(52) U.S. Cl.
CPC .......... *H10P 90/126* (2026.01); *H10P 50/242* (2026.01)

(58) Field of Classification Search
None
See application file for complete search history.

(56) References Cited

U.S. PATENT DOCUMENTS

| | | | |
|---|---|---|---|
| 4,946,547 A | | 8/1990 | Palmour et al. |
| 4,981,551 A | * | 1/1991 | Palmour ............. H01L 21/0475 |
| | | | 438/712 |
| 2016/0218003 A1 | * | 7/2016 | Hirooka .................. C30B 29/36 |

FOREIGN PATENT DOCUMENTS

| | | | |
|---|---|---|---|
| CN | 105632901 | * | 6/2016 |
| CN | 106816372 | * | 6/2017 |

(Continued)

OTHER PUBLICATIONS

H. Mikami et al., "Role of Hydrogen in Dry Etching of Silicon Carbide Using Inductively and Capacitively Coupled Plasma." Japanese Journal of Applied Physics, vol. 44, No. 6A, pp. 3817-3821, 2005.

(Continued)

*Primary Examiner* — Stephanie P Duclair
(74) *Attorney, Agent, or Firm* — BLANK ROME LLP

(57) ABSTRACT

A method of preparing a silicon carbide wafer for subsequent epitaxial growth thereon is disclosed. The method comprises (a) placing the silicon carbide wafer onto a support table in a plasma processing chamber such that the surface of the silicon carbide wafer distal to the support table is unmasked; (b) establishing a flow of an etch gas mixture into the plasma processing chamber, wherein the etch gas mixture comprises molecular hydrogen, $H_2$; and (c) generating a plasma from the etch gas mixture within the plasma processing chamber and using the plasma to etch the unmasked surface of the wafer so as to reduce the roughness of the unmasked surface.

19 Claims, 3 Drawing Sheets

(56)    References Cited

FOREIGN PATENT DOCUMENTS

| | | | |
|---|---|---|---|
| JP | 2010111540 | A | 5/2010 |
| JP | 2019131451 | A | 8/2019 |
| KR | 100373460 | B1 | 2/2003 |
| RU | 2708812 | C1 | 12/2019 |
| WO | 2010073006 | A1 | 7/2010 |
| WO | 2015017899 | A1 | 2/2015 |

OTHER PUBLICATIONS

E. Ducke et al., "A Method of Preparation of Highly Perfect 6H-SiC Surfaces." Silicon Carbide and Related Materials 1995: Proceedings of the Sixth International Conference, Kyoto, Japan, pp. 609-612, 1995.

H. Watanabe et al., "Surface Cleaning and Etching of 4H-SiC (0001) Using High-Density Atmospheric Pressure Hydrogen Plasma." Journal of Nanoscience and Nanotechnology, vol. 11, No. 4, pp. 2802-2808, 2011.

H. Mikami et al., "Reduction of Fluoride Species and Surface Roughness by H2 Gas Addition in SiC Dry Etching." Materials Science Forum, vol. 483-485, 757-760, 2005.

International Search Report for corresponding PCT Application No. PCT/GB2021/052423 dated Feb. 23, 2022.

Pankratiev, P. et al., Selective SiN/SiO2 Etching by SF6/H2/Ar/He Plasma, Research Article, Nov. 26, 2019, AIP conf., Proc. 2179, 020017 (2019), https://doi.org./10.1063/1.5135490, pp. 020017-1-020017-4.

Japanese Office Action with partial English translation received in corresponding Patent Application No. JP2023-518122, dated Nov. 13, 2025.

\* cited by examiner

METHOD OF PREPARING A SILICON CARBIDE WAFER

FIELD OF THE INVENTION

The invention relates to methods of preparing silicon carbide wafers for epitaxial growth thereon.

BACKGROUND

Silicon carbide (SiC) crystals possess various physical properties that make them an attractive choice for the construction of semiconductor devices, for example a high thermal conductivity and resistance to corrosion. In particular, developments in green technologies such as electric vehicles has, in recent years, led to increased demand for SiC wafers.

In order to carry out epitaxial growth on the surface of an SiC wafer, the roughness of the surface, which we define herein as the arithmetic average roughness $R_a$, must be very low, typically well below 3 nanometres (nm), preferably below 1 nm and more preferably below 0.5 nm. SiC wafers are typically obtained by slicing segments from a larger crystal ingot, obtained, for example, by growth from a melt. The slices are lapped to the required thickness and then mechanically polished to reduce the roughness of their surfaces, and this mechanical polishing step typically reduces the surface roughness from an initial value in the range of about 100-150 nm to one in the range of 5-10 nm. In order to further reduce the roughness to a value suitable for epitaxial growth, a subsequent chemical mechanical polishing (CMP) step is typically performed. CMP processes involve polishing the surface of the wafer with a slurry containing an abrasive and one or more corrosive compounds that are capable of chemically etching the surface of the wafer.

A problem with the conventional process of manufacturing SiC wafers is that the various stages described above are time-consuming and therefore limit the rate of production. The CMP step in particular adds complexity and incurs a risk of damaging the surface and underlying crystal structure of the wafer due to the necessary involvement of corrosive substances. There is hence a need for a way of manufacturing SiC wafers that overcomes these limitations.

SUMMARY OF THE INVENTION

A first aspect of the invention provides a method of preparing a silicon carbide wafer for subsequent epitaxial growth thereon, the method comprising: (a) placing the silicon carbide wafer onto a support table in a plasma processing chamber such that the surface of the silicon carbide wafer distal to the support table is unmasked; (b) establishing a flow of an etch gas mixture into the plasma processing chamber, wherein the etch gas mixture comprises molecular hydrogen, $H_2$; and (c) generating a plasma from the etch gas mixture within the plasma processing chamber and using the plasma to etch the unmasked surface of the wafer so as to reduce the roughness of the unmasked surface.

Surprisingly, it has been found that etching the surface of an SiC wafer using plasmas generated from etch gases comprising $H_2$ can significantly reduce the surface roughness of the wafer from its initial value to a value sufficiently low as to allow the etched surface to be used for epitaxial growth without any subsequent processing. The invention thereby eliminates the need to chemically mechanically polish the wafer and thus provides a faster and more economical process for the manufacture of SiC wafers suitable for epitaxial growth.

Much of the variation in the surface profile at the scale of 1-10 nm is due to the presence of defects at or near the surface, for example pipes, screw dislocations, edge dislocations and vacancies. The inventors have found that plasmas generated from etch gas mixtures comprising $H_2$ tend to etch into such defects and the surrounding uniform crystalline structure at similar rates, thereby allowing the layer of material containing the defects to be removed without amplifying the variation in the surface profile. Without wishing to be bound by theory, it is suggested that the adsorption of $H_2$ molecules and/or hydrogen radicals onto the surface of the wafer alters the sputtering yield generated by ions from the plasma as they collide with the surface of the wafer in a manner that depends on the angle of incidence between the surface and the ion, and that the resultant etching favours those parts of the wafer surface that are oriented at a non-parallel angle to the nominal plane of the wafer. The hydrogen thus has a moderating effect on the etching of the parts of the surface that lie in the nominal plane of the unmasked surface of the wafer and favours the removal of irregularities in the surface profile.

As noted above, the SiC wafer is arranged with an unmasked surface distal to the support table. "Unmasked" here means that the surface in question is not covered by a patterned mask, such as would be provided for etching a structure such as an integrated circuit into the wafer. In other words, there is no mask disposed anywhere on the relevant surface of the wafer, since the process is one of preparing the wafer surface for subsequent epitaxial growth over substantially the whole surface, and does not itself introduce a pattern. It should be noted that the surface of the wafer is not necessarily completely uncovered—for example, parts of the surface distal to the support table could be covered by clamps for holding the wafer in place—but it is preferable that most or all of the surface is uncovered (at least throughout step (c)) so that substantially all of the surface receives a uniform degree of exposure to the plasma.

In preferred implementations the etch gas mixture further comprises a noble gas, preferably argon, Ar, wherein preferably the ratio of $H_2$ to the noble gas in the etch gas mixture is in the range of 5:1 to 1.5:1, preferably in the range of 4.5:1 to 2:1. Ionised noble gases, in particular argon, promote the interaction of reactive species such as hydrogen radicals in the plasma with the surface of the wafer by breaking chemical bonds in the SiC lattice. Collisions of noble gas ions with the surface of the wafer also assist the etching by sputtering material from the surface. The ratios above have been found to be particularly suitable for processes in accordance since they have been found to achieve significant reductions in the roughness of the etched surface of the wafer. Where a noble gas such as argon is present in the etch gas mixture, preferably 5% to 40% of the etch gas mixture consists of the noble gas, more preferably 10% to 35%, most preferably 15% to 30%. Again, etch gases comprising a noble gas such as argon present in these quantities have been found to achieve substantial reductions in the roughness of the etched surface of the wafer. Where a noble gas is present in the etch gas mixture, it has been found that the sputtering action is greatly enhanced when the mass of the bombarding noble gas ions is greater than or equal to that of the Si atoms being sputtered, which have an atomic weight of about 28. Hence, in particularly preferred implementations, the noble gas has an atomic weight greater than or equal to 28, and most preferably the noble gas is argon, Ar. As noted above, argon has been found to be particularly effective, though other noble gases with atomic weights greater than 28 (for example krypton and xenon) are also suitable.

In preferred implementations the etch gas mixture further comprises one or more fluorine-bearing gases each configured to release fluorine radicals when in the plasma, wherein preferably each fluorine-bearing gas is one of sulphur hexafluoride, $SF_6$, carbon tetrafluoride, $CF_4$, nitrogen trifluoride, $NF_3$, and molecular fluorine, $F_2$. By a "fluorine-bearing gas" we mean any gas which, when present in the plasma, dissociates in such a manner that it releases free atomic fluorine into the plasma. Although such gases are widely regarded as suitable for etching vertical features such as trenches and mesas, the inventors have found that, surprisingly, the presence of a fluorine-bearing gas in the etch gas mixture when performing the method defined above can achieve a reduction in the roughness of the etched surface of the SiC wafer. As explained above, it is suggested that the presence of $H_2$ in the etch gas mixture causes the sputter yield to vary with the angle between the trajectory of the incident ion and the part of the surface of the SiC wafer with which it collides in such a way that promotes the etching of surfaces non-parallel to the nominal plane of the wafer. It is believed that this effect is enhanced by the presence of fluorine-bearing gases acting as etchants in the etch gas mixture. In particular, etch gas mixtures comprising $SF_6$ have been demonstrated to achieve significant reductions in the roughness of the etched surface. Where a fluorine-bearing gas is present, the ratio of $H_2$ to the fluorine bearing gas in the etch gas mixture is preferably in the range of 100:1 to 5:1, preferably in the range of 50:1 to 20:1. These compositions have been found to be particularly effective at reducing the roughness of the etched wafer surface. More generally, when a fluorine-bearing gas is present in the etch gas mixture, it is preferred that there is more $H_2$ than fluorine-bearing gas in the mixture. It has been found that these compositions generally benefit from the etching effect of the fluorine-bearing gas while achieving good reductions in the surface roughness of the etched surface.

Advantageously, at least 20% of the etch gas mixture may consist of $H_2$, preferably at least 40%, more preferably at least 50%, most preferably at least 60%. Etch gas mixtures in which hydrogen is present at these levels have been found to achieve particularly large reductions in the surface roughness of the etched surface.

In particularly preferred embodiments, the etch gas mixture consists essentially of $SF_6$, $H_2$ and Ar, wherein preferably the ratio of $SF_6$:$H_2$:Ar is approximately 1:40:10. Methods in accordance with the first aspect of the invention have been demonstrated to achieve the desired reduction in surface roughness using etch gas mixtures containing only these compounds, and in these embodiments the particular composition of approximately 1:40:10 has been found to achieve the best results. Of course, other species may incidentally be present at trace levels without comprising the ability of the method to achieve the desired result. By approximately 1:40:10, we mean that each part of this ratio is within 20% of the stated values, preferably within 10%.

In preferred implementations, during step (c) the pressure in the plasma processing chamber is controlled to a value in the range of 1 to 20 millitorr (mTorr), preferably 4 to 6 mTorr, more preferably about 5 mTorr. The greatest reductions in surface roughness have been observed under these conditions. Performing step (c) under pressures in these ranges has been found to be particularly beneficial where a noble gas (in particular one with an atomic weight greater than or equal to 28, such as argon) is present in the gas mixture. It is believed that under these low pressures, the plasma in the chamber is sufficiently rarefied that the noble gas ions are able to bombard and sputter material from the surface of the wafer without substantially being impeded by other species in the plasma. This ensures that the angle-dependent etching promoted by the $H_2$ in the mixture (described above) proceeds effectively, which produces a high level of smoothing across the unmasked surface being etched.

The plasma is preferably generated with a plasma power in the range of 1000 to 3000 watts (W), preferably in the range of 2000 to 3000 W, more preferably about 2500 W.

Advantageously, in step (c), the etch may be performed for between 15 and 25 minutes, preferably about 20 minutes. It has been found that the surface roughness of the SiC wafer can be reduced to values suitable for epitaxial growth by etches of this duration when performed as part of a method in accordance with the first aspect of the invention.

Preferably step (c) further comprises applying a bias voltage to the substrate table, wherein preferably the bias voltage has a power in the range of 200 to 1200 W, more preferably 800 to 1200 W, most preferably about 1000 W. This has been found to enhance the etch rate (thus increasing the speed with which the wafer can be prepared for epitaxial growth) while still achieving reducing the roughness of the unmasked surface.

A second aspect of the invention provides a method of preparing a silicon carbide wafer for subsequent epitaxial growth thereon, the method comprising: (a) placing the silicon carbide wafer onto a support table in a plasma processing chamber such that the surface of the silicon carbide wafer distal to the support table is unmasked; (b) establishing a flow of an etch gas mixture into the plasma processing chamber, wherein the etch gas mixture comprises: one or more fluorine-bearing gases configured to release fluorine radicals when in a plasma; and one or more polymer-forming fluorocarbons and/or one or more polymer-forming hydrofluorocarbons; and (c) generating a plasma from the etch gas mixture within the plasma processing chamber and using the plasma to etch the unmasked surface of the wafer so as to reduce the roughness of the unmasked surface.

This method of the second aspect of the invention differs from that provided by the first aspect in that the etch gas mixture is only required to comprise one or more fluorine-bearing gases and one of more polymer-forming fluorocarbons. Like that of the first aspect, the method of the second aspect of the invention has been found to be capable of reducing the surface roughness of the SiC wafer to a value sufficiently low for performing epitaxial growth thereon and eliminates the need to perform a CMP process. It is believed that the mechanism by which these results are achieved is similar to that outlined above with reference to the first aspect, but with the polymer-forming fluorocarbon(s) and/or hydrofluorocarbon(s) taking the place of hydrogen in promoting etching of parts of the surface that lie non-parallel to the nominal plane of the wafer. By "polymer-forming (hydro)fluorocarbon" we mean any (hydro)fluorocarbon which, when present in the plasma, is capable of forming a polymer layer on the surface of the SiC wafer. These compounds are distinguished from such fluorine-bearing gases as $CF_4$ which are not, without the addition of other gases, capable of forming polymers in a plasma.

It is believed that the effect of the fluorine-bearing gas(es) in methods in accordance with the second aspect is similar to that described above with reference to the first aspect of the invention, i.e. that their behaviour as etchants is influenced by the presence of the polymer layer on the surface of the SiC wafer in such a way that leads them to selectively attack parts of the wafer surface that are non-parallel to its nominal plane.

The one or more fluorine-bearing gases may advantageously comprise one or more of sulphur hexafluoride, $SF_6$, carbon tetrafluoride, $CF_4$, nitrogen trifluoride, $NF_3$, and molecular fluorine, $F_2$.

Octafluorocyclobutane, $c$-$C_4F_8$, and trifluoromethane, $CHF_3$, are respectively examples of a fluorocarbon and a hydrofluorocarbon which been found to be suitable for performing methods in accordance with the second aspect of the invention. In preferred embodiments, the etch gas mixture comprises one or both of these compounds (and optionally other fluorocarbons and/or hydrofluorocarbons).

Advantageously, the ratio of the fluorine-bearing gas to the polymer-forming fluorocarbons and/or polymer-forming hydrofluorocarbons in the etch gas mixture may be in the range of 15:1 to 3:1, preferably about 7:1. By this we mean that the sum of all of the fluorocarbons and hydrofluorocarbons is present at these levels, rather than each one individually. Etch gases with this composition have been found to be particularly effective at reducing the surface roughness of the SiC wafer.

Preferably at least 90% of the etch gas mixture consists of the fluorine-bearing gas and the one or more polymer-forming fluorocarbons and/or polymer-forming hydrofluorocarbons, preferably at least 95%, more preferably substantially all of the etch gas mixture. It has been found that no other species need be present in the etch gas mixture in order to achieve the necessary reduction in surface roughness, though even where substantially all of the etch gas mixture comprises these substances, trace levels of other species may be present.

In preferred embodiments, during step (c) the pressure in the plasma processing chamber is controlled to a value in the range of 1 to 20 mTorr, preferably in the range of 2 to 6 mTorr, most preferably about 3 mTorr. Significant reductions in surface roughness have been achieved with pressure values in this range.

Preferably the plasma is generated with a plasma power in the range of 2600 to 3800 W, more preferably about 3200 W.

Advantageously, in step (c), the etch is performed for between 5 and 15 minutes, preferably about 10 minutes. It has been found that the surface of the SiC wafer can be made sufficiently smooth for epitaxial growth by an etch with a duration in this range.

Preferably step (c) further comprises applying a bias voltage to the substrate table, wherein preferably the bias voltage has a power in the range of 100 to 1200 W, preferably 640 to 960 W, more preferably about 800 W.

A third aspect of the invention provides a method of preparing a silicon carbide wafer for subsequent epitaxial growth thereon, the method comprising: (a) placing the silicon carbide wafer onto a support table in a plasma processing chamber such that the surface of the silicon carbide wafer distal to the support table is unmasked; (b) establishing a flow of an etch gas mixture into the plasma processing chamber, wherein the etch gas mixture comprises at least hydrogen bromide, HBr, and oxygen, $O_2$; and (c) generating a plasma from the etch gas mixture within the plasma processing chamber and using the plasma to etch the unmasked surface of the wafer so as to reduce the roughness of the unmasked surface.

Like the methods of the first and second aspects of the invention, this method has been found to reduce the surface roughness of the SiC wafer from its initial value to a level that permits epitaxial growth to be performed thereon. In this case, the essential components of the etch gas mixture are hydrogen bromide and oxygen. It is believed that hydrogen bromide plays a role in the etching process that is analogous to that of hydrogen in the first aspect of the invention as outline above, i.e. to moderate the etching of parts of the wafer that lie in the nominal plane of the unmasked surface. The oxygen has been found to enhance the ability of the plasma to remove material from the unmasked surface of the wafer, and is believed to preferentially etch features of the surface that lie out of the nominal plane of the unmasked surface when present in combination with hydrogen bromide.

It has been found that the best results are achieved when HBr is present at a substantial level in the etch gas mixture, so preferably at least 40% of the etch gas mixture consists of HBr, more preferably at least 50%, most preferably at least 60%.

In preferred implementations, the ratio of $HBr$:$O_2$ in the etch gas mixture is in the range of 3:1 to 1.5:1, more preferably about 2:1. The enhancing effect of $O_2$ on the ability of the plasma to remove material from the surface of the wafer has been found to be particularly strong with these compositions.

The etch gas mixture preferably further comprises one or more halogen-bearing gases that do not comprise bromine. As will be discussed in more detail below, these could be fluorine-bearing gases or other halogen-bearing gases such as other hydrogen halides (e.g. HCl). In particularly preferred implementations, however, the one or more halogen-bearing gases do comprise one or more fluorine-bearing gases each configured to release fluorine radicals when in the plasma, wherein preferably each fluorine-bearing gas is one of sulphur hexafluoride, $SF_6$, carbon tetrafluoride, $CF_4$, nitrogen trifluoride, $NF_3$, and molecular fluorine, $F_2$. The effect of these compounds here is thought to be similar to that described above in the context of the first and second aspects of the invention, i.e. to etch the surface of the SiC wafer in manner that favours removal of material from parts of the surface that are lie outside of the nominal plane of the unmasked surface. Preferably the ratio of HBr to the fluorine bearing gas in the etch gas mixture is in the range of 100:1 to 2:1, more preferably in the range of 7:1 to 3:1. This has been found to achieve the most effective reduction in the roughness of the etched surface.

In preferred implementations, the etch gas mixture consists essentially of $SF_6$, $O_2$ and HBr, wherein the ratio of $SF_6$:$O_2$:HBr is approximately 1:1:4 or 1:4:6, since it has been found that no other species need be present in order to achieve the desired results and these ratios have been found to be particularly effective. However, it will be understood that other species may be present at trace levels without appreciably reducing the quality of the results achieved.

Preferably during step (c) the pressure of the plasma is controlled to a value in the range of 5 to 20 millitorr (mTorr), preferably 12 to 18 mTorr, most preferably about 15 mTorr. These values have been found to be most suitable for performing methods in accordance with the third aspect of the invention.

Preferably the plasma is generated with a plasma power in the range of 2400 to 3600 W, most about 3000 W.

In preferred embodiments of the third aspect, in step (c) the etch is performed for between 5 and 15 minutes, preferably about 10 minutes. This duration has been found to be sufficient to prepare the surface for epitaxial growth.

Preferably step (c) further comprises applying a bias voltage to the substrate table, wherein preferably the bias voltage has a power in the range of 100 to 1200 W, preferably 320 to 480 W, most preferably about 400 W. As noted above, biasing the substrate table enhances the etch rate, and these values have been shown to do so while achieving a reduction in the roughness of the unmasked surface.

In the foregoing discussion, three processes have been introduced together with preferred features and parameters particular to each one. We will now set out further preferred features that may be implemented as part of any of the three methods above.

In methods in accordance with each of the three aspects of the invention above, during step (a) the unmasked surface preferably has a roughness of at least 1 nm, preferably at least 3 nm, more preferably at least 5 nm. The methods above have been found to be capable of preparing surfaces of SiC wafers having initial roughness values within these ranges for epitaxial growth. However, in other embodiments the roughness of the unmasked surface during step (a) may be less than 1 nm, since reductions in roughness have also been achieved for surfaces with initial roughness values within this range.

As explained above, the methods provided by the present invention are capable of preparing the etched surface of the SiC wafer for the growth of epitaxial layers. Hence, the method preferably comprises after step (c): (d) growing an epitaxial layer of a material on the etched surface for the wafer.

In some preferred implementations, between steps (c) and (d), the wafer is removed from the plasma processing chamber and placed inside a chamber for epitaxial growth, and step (d) is performed while the wafer is in the chamber for epitaxial growth. The epitaxial growth is thus performed in a different chamber to that in which the etch is performed. Separate apparatus suitable for performing each of these steps is readily available, so these embodiments are advantageous in that they can be performed with convention equipment. Hence, in particularly preferred implementations, step (d) comprises: (d1) evacuating the plasma from the plasma processing chamber; (d2) transferring the wafer to an epitaxial growth chamber; and (d3) establishing a flow of a vapour into the epitaxial growth chamber so as to grow the epitaxial layer of the material. In these embodiments, the vapour may comprise the material and/or one or more precursors suitable for forming the material on the etched surface of the silicon carbide wafer. The material and/or precursors could be chosen such that the epitaxial layer is a layer of SiC. Step (d3) could be repeated with the same or different materials/precursors in order to grow a series of epitaxial layers suitable for manufacturing electronic devices and other such products. In particularly preferred embodiments, the epitaxial growth chamber and the plasma processing chamber are comprised by a single plasma processing tool. This can allow the wafer to be conveyed between the plasma processing chamber and the epitaxial growth chamber without being handled or transported over large distances, which will minimise the risk of damage to the etched surface during transit.

In alternative implementations, the etching step (c) and the epitaxial growth step (d) may be carried out in separate processing tools, potentially even at different locations and by different entities. For example, the etching step (c) could be performed by the wafer manufacturer, and the subsequent epitaxial growth step may be performed by a device manufacturer, having sourced the wafer from the wafer manufacturer.

In all of the methods described above, the process is preferably controlled so as to perform a blanket etch of the unmasked surface of the wafer. A blanket etch is one in which substantially all of the unmasked surface receives the same degree of processing, which in the present invention will result in a uniform level of roughness across the etched surface. Performing a blanket etch thus allows a large area to be prepared for epitaxial growth.

In preferred embodiments, the unmasked surface of the wafer includes at least a circular unmasked area with a diameter of at least 100 millimetres, preferably at least 150 millimetres, more preferably at least 200 millimetres. By this we mean that it is possible to identify, within the unmasked area of the surface, a circular zone having a diameter of this minimum lateral dimension within which no mask of the kind described above is present. However, it will be appreciated that the actual periphery of the unmasked area may, potentially, not be circular (although this will be so in the preferred example of a completely unmasked, circular wafer being etched). Typically this minimum dimensions corresponds to a diameter of the wafer: for example, for a circular unmasked surface, diameter referred to above is simply the diameter of the circle, and for a square surface, it is the side length of the square. For a rectangular unmasked surface, this diameter is the smaller of the two side lengths of the rectangle. A larger diameter of this notional circular area typically signifies that a greater area on the surface of the wafer will be prepared for epitaxial growth by the etching step, and methods in accordance with the present invention have been demonstrated to successfully prepare unmasked areas of SiC wafer having minimum dimensions in the ranges recited above.

In some preferred implementations, the method comprises before step (a), slicing the wafer from an SiC crystal. In these embodiments, the wafer is preferably not subjected to chemical mechanical polishing (CMP) between the step of slicing the wafer from the SiC crystal and step (a). As explained above, methods in accordance with the first, second and third aspects of the invention are capable of preparing the surface of an SiC wafer for epitaxial growth thereon without the need for chemical mechanical polishing, so it is preferred that no such process is performed. This is advantageous as it eliminates the risk of the corrosive substances involved in the CMP damaging the surface and/or underlying crystal structure of the wafer.

Advantageously, the wafer is oriented such that the unmasked surface is a silicon face. This is can be achieved by slicing the SiC wafer from a larger crystal in such an orientation that at least one surface of the wafer is terminated in silicon atoms (as opposed to carbon). The methods of the present invention have been found to be particularly effective when the unmasked surface is a silicon face.

Preferably the silicon carbide wafer comprises non-epitaxially grown silicon carbide, and the surface etched in step (c) is of non-epitaxially grown silicon carbide. As noted above, this can be achieved by slicing the wafer from a larger crystal ingot, which can be grown from a melt, for example.

In preferred implementations, step (c) further comprises delivering helium to the surface of the wafer proximal to the substrate table so as to cool the wafer, wherein preferably the helium is delivered at a pressure in the range of 1 to 10 Torr, most preferably about 2 Torr. This feature is sometimes referred to as "helium backside cooling" and ensures that the wafer is not damaged by, for example, thermal stresses induced by the heat from the plasma. It also ensures that the conditions at the surface of the wafer are uniform across the unmasked surface, which in turn promotes a degree of processing by the plasma. In many embodiments the wafer be shaped such that the surface proximal to the substrate table is approximately parallel to the unmasked surface, in which case this leads to particularly uniform cooling of the unmasked surface of the wafer.

Preferably during step (c) the temperature of the substrate table is controlled to a value in the range of 5 to 30 degrees Celsius (° C.), preferably in the range of 15 to 25° C., most preferably about 20° C. This can be achieved for example by recirculation of a fluid or by any other cooling process, examples of which are well-known. Again, this prevents the wafer being damaged by heat and ensures uniform processing across the unmasked surface.

In step (c), the plasma may advantageously be generated by an inductively-coupled plasma source. The plasma could, however, be generated by an alternative source such as a capacitive coupled plasma source.

As explained above, methods in accordance with the first, second and third aspects of the invention have been found to substantially reduce the roughness of the unmasked surface of the wafer, so preferably the roughness of the unmasked surface is reduced by at least 60%. Moreover, the roughness of the unmasked surface is preferably reduced to 3 nm or less, more preferably 1 nm or less, still more preferably 0.5 nm or less, as this will result in a surface that is particularly suitable for epitaxial growth.

In preferred embodiments, in step (a) the unmasked surface has a roughness $R_a$ in the range of 1 to 100 nm, preferably in the range of 1 to 10 nm. Furthermore, in some preferred implementations the roughness of the unmasked surface in step (a) may be at least 5 nm. The disclosed methods have been found to be capable of preparing surfaces suitable for epitaxial growth from surface with initial roughness values in these ranges.

Advantageously, step (c) may further comprise: (c1) applying a bias voltage to the substrate table with a first power, P1, for a first time period; and (c2) after (c1), applying the bias voltage to the substrate table with a second power, P2, for a second time period, wherein P2 is less than P1, preferably less than 0.5 times P1. By lowering the bias power for a period of time at the end of the etching step, the typical amount of energy carried by the ions colliding with the surface is reduced and this results in less material being removed by each collision. At the end of step (c1), the roughness of the surface will have been reduced from its initial value, so step (c2) allows for the remaining, typically smaller aberrations in the surface to be removed while reducing the risk of damage to the surface caused by high-energy ions. Step (c2) can be referred to as a "soft landing" step. A "soft landing" in which the effects of damage from high-energy collisions are mitigated can also be achieved by, during a final part of step (c), performing a cyclical atomic layer etching (ALE) process, preferably one which is controlled so as to remove a layer at least 1 nm thick from the unmasked surface. This may be achieved by performing approximately 5 cycles of the atomic layer etching process. The ALE process may be performed as an alternative to step (c2) or in addition to step (c2) after the substrate table bias has been reduced.

Preferably, P2 is in the range of 50 to 200 W and/or the second time period is in the range of 2 to 10 minutes. These parameters have been found to achieve particularly effective smoothing of the surface in step (c2).

In preferred implementations, during step (c2), a layer of 2 to 10 nm thickness is removed from the unmasked surface by the etching. This can be achieved by a soft landing step having a time period in the range of 2 to 10 minutes as stated above.

BRIEF DESCRIPTION OF THE DRAWINGS

Examples of methods in accordance with aspects of the invention will now be described with reference to the accompanying drawings, in which.

DETAILED DESCRIPTION

Figure 1:
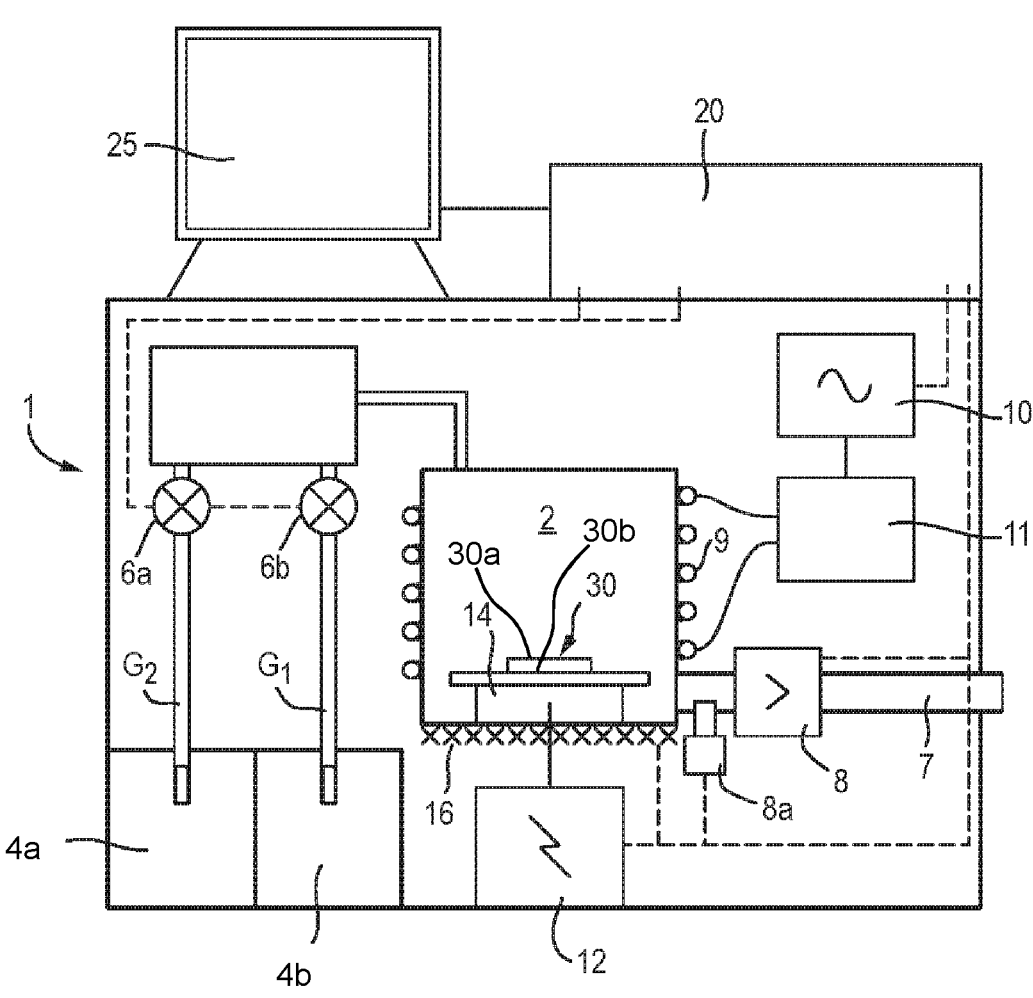
FIG. 1 schematically depicts an exemplary surface processing tool adapted to carry out methods in accordance with the first, second and third aspects of the invention.

FIG. 1 shows an example of a plasma processing tool suitable for implementing the presently disclosed methods. The plasma processing tool 1 comprises a plasma processing chamber 2 within which a silicon carbide (SiC) wafer 30 is placed during use. To perform etching, an etch gas mixture comprising one or more gases is introduced to the plasma processing chamber 2 and the conditions controlled in order to effect the desired etching mechanism. The process parameters within the chamber are controlled and can be adjusted by a set of at least one (but more typically a plurality of) devices, of which examples are shown schematically in FIG. 1. In this example, the tool 1 is equipped with two input gas supplies 4(a) and 4(b) for supplying first and second input gases, G1 and G2 respectively, to the plasma processing chamber 2. Some embodiments of the invention employ etch gas mixtures comprising more than two gases, and it will be understood that the plasma processing tool 1 may have any number of gas supplies each configured to supply a respective one of the component gases of the etch gas mixture. The ingress of each gas to the chamber 2 is controlled by valves 6(a) and 6(b) and respective mass flow controllers (not shown). Again, additional mass flow controllers may be provided where more than two gases are comprised by the etch gas mixture. The exhaust gas, including unreacted input gases and any reaction products, is removed from plasma processing chamber 2 via a duct 7 and associated pump(s) 8, the pump(s) 8 typically being capable of reducing the pressure within the chamber to near-vacuum conditions. The chamber pressure will be determined in the main part by the exhaust pump system and particularly the pumping speed and the "conductance" of the pumping line from the chamber to the pump (this is a factor related to the geometry of the pumping line). However during processing, when a plasma is created and/or when etching (or indeed deposition, as will be discussed later) takes place, gaseous species may be lost or created inside the chamber thereby having an effect on the pressure. In order to regulate for such variation, an automatic pressure control valve 8a is preferably provided as known in the art. The valve 8a changes the conductance of the pumping line to thereby enable the chamber pressure to be maintained substantially constant at the desired level as the plasma is struck and the material etched.

The plasma processing tool 1 is equipped with a plasma source for generating a plasma within the plasma processing chamber by means of an electrical discharge. Here, the plasma source is depicted as an inductively-coupled plasma source comprising a coil 9 surrounding the plasma processing chamber 2, which is supplied with RF power from power supply 10 via a RF matching unit 11. The RF matching unit 11 is configured to match the plasma impedance to that of the RF supply 10 in order to maximise efficiency of power transfer from the supply to the plasma. An example of a suitable matching unit is disclosed in WO-A-2010/073006. Other types of plasma source such as a capacitively-coupled plasma (CCP) or a microwave plasma source could be used instead.

The wafer 30 is mounted in use on a substrate table 14. As described below, a bias voltage is applied in use to the substrate 30 and this is achieved by connecting a voltage source 12 to the substrate table 14. If an RF power supply 12 is used then an Automatic impedance Matching Unit (AMU) may preferably be provided to ensure good coupling of power from the power supply 12 to the substrate table 14. The tool 1 may further comprise a temperature control unit 16 such as a heater and/or cooling system for adjusting the processing temperature of the substrate (additional devices for heating and/or cooling of the plasma processing chamber and plasma source may be provided to assist with process control and/or to maintain hardware stability). For instance, where etching is primarily to be carried out, the wafer 30 may be supplied with a coolant to prevent the significant amount of energy transferred to the substrate during ion bombardment and/or during exothermic chemical reactions causing an undesirable increase in the substrate temperature. The coolant could be helium, for example, which may be supplied to a surface 30b of the wafer 30 proximal to the substrate table 14. Preferably the helium is supplied to the surface 30b at a pressure of about 2 Torr.

As explained above, some embodiments of the invention involve growing an epitaxial layer on the surface 30a of the wafer 30 after the etching step. This step can be performed using a plasma processing tool 1 in which the gas supplies 4(a), 4(b) are configured to supply materials and/or precursors suitable for forming an epitaxial layer on the surface of the wafer. Of course, other methods of growing epitaxial layers could also be employed in these embodiments.

The devices operate upon instruction from a controller 20, such as a programmable logic controller (PLC) or similar. In some cases, more than one controller can be provided, with each controller controlling one or a subset of the devices. The controller is also connected to a user interface device such as a computer workstation 25 for receiving input from the user and/or returning outputs.

In FIG. 1, the data connections between the various devices and the controller 20 are indicated by dashed lines. In practice, this may be implemented as a network such as a CANbus bridge, which has connections to each of the devices as well as the user interface 25. The bus typically comprises multiple network channels including one or more data channels such as serial data channels (e.g. RS485) and, optionally, one or more power channels. The controller 20 issues commands across the bus, each of which is addressed to one or more of the devices and includes instructions as to one or more process parameters the device in question is to implement. An example of a network protocol which could be used for the issuing of commands for the control of the devices is given in WO-A-2010/100425. Of course, many other network implementations are possible as will be appreciated by the skilled person.

Figure 2:
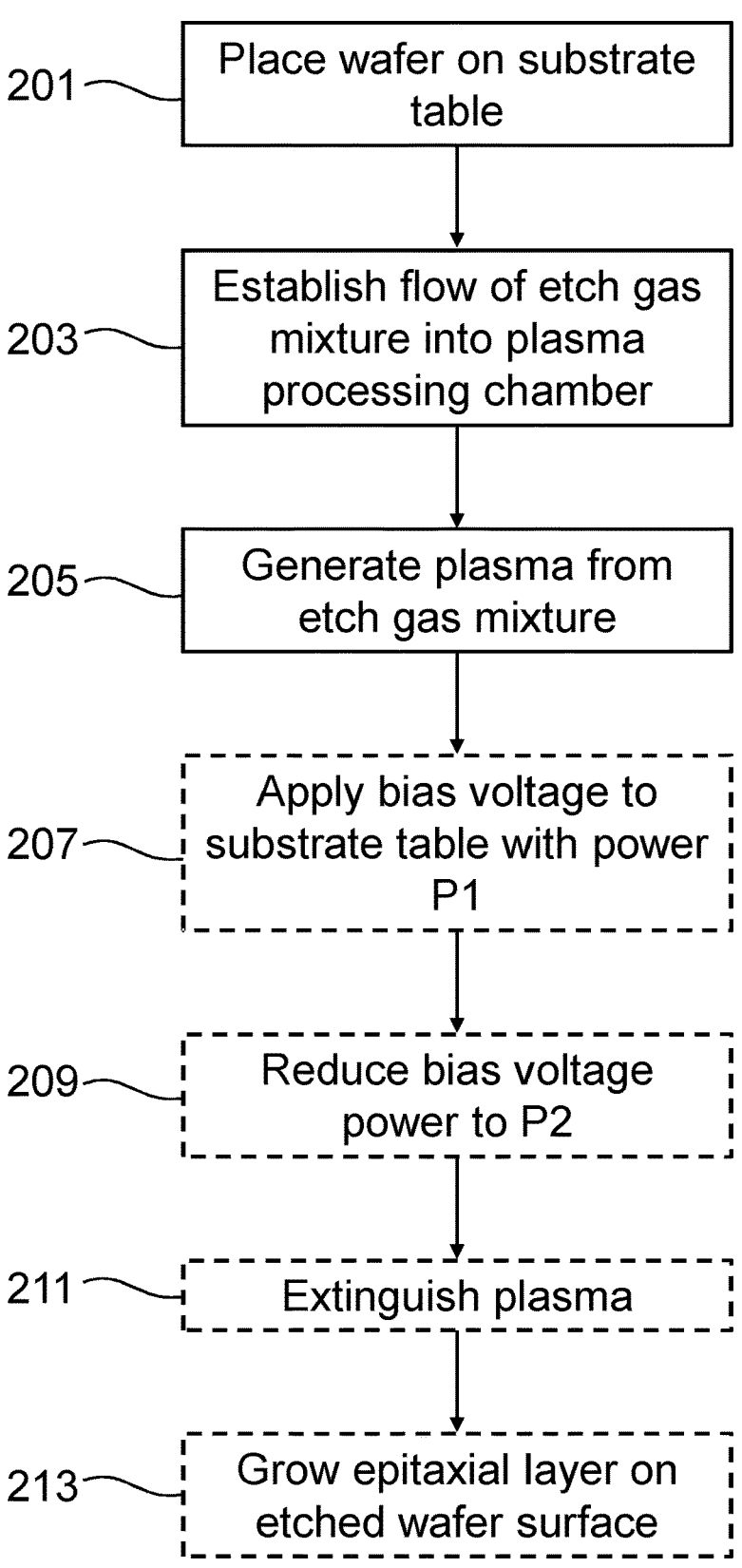
FIG. 2 shows an example of a process in accordance with embodiments of the invention.

FIG. 2 illustrates a method of preparing an SiC wafer and performing subsequent epitaxial growth thereon in accordance with the first, second and third aspects of the invention. This method will be described with reference to the exemplary plasma processing tool 1 of FIG. 1, though it will be understood that the same method could be practised with other apparatus.

In step 201, an SiC wafer 30 is placed on the substrate table 14 inside the plasma processing chamber 2 as shown in FIG. 1. The SiC wafer 30 preferably consists of SiC only, though some impurities may be present, for example dopants. The SiC in the wafer 30 is preferably non-epitaxially grown, and may be grown from a melt, for example. The SiC wafer 30 is positioned on the substrate table 14 such the surface 30a distal to the substrate table 14 is unmasked, i.e. is not covered by a mask such as a patterned photoresist layer such that when a plasma is generated in the plasma processing chamber 2, substantially all of the surface 30a is exposed to the plasma. Usually the wafer 30 will be in the shape of a thin disc, having been obtained by slicing from a larger cylindrical ingot. Typically wafers produced in this way have diameters in the range of 100 to 200 millimetres (mm) and thicknesses in the range of 200 to 700 microns (μm). During step 201, the arithmetic average roughness of the unmasked surface 30a is preferably at least 1 nm and preferably also less than 100 nm, more preferably less than 10 nm. Roughness values in this range are typical of wafers that have been mechanically polished (but not chemically mechanically polished) as explained above.

Once the wafer 30 has been placed on the substrate table 14, a flow of an etch gas mixture into the chamber from the gas sources 4(a), 4(b) is established in step 203, and then a plasma is generated from this mixture at step 205 by powering the inductively coupled plasma source. Which gases are supplied in step 203 depends on which of the first, second and third aspects of the inventions is being performed, and detailed examples of etch gas mixtures suitable for implementing each aspect of the invention will be described later together with the other relevant process parameters. To illustrate this by way of a brief example, embodiments of methods in accordance with the second aspect of the invention could involve supplying a fluorine-bearing gas such as $SF_6$ from one gas supply 4(a) and a polymer-forming hydrofluorocarbon such as $CHF_3$ from a second gas supply 4(b) during step 203.

For as long as the plasma is sustained by the plasma source, it etches the unmasked surface 30a of the wafer 30. Since the surface 30a is unmasked, the etching occurs in a substantially uniform manner across the unmasked surface 30a and may thus be described as a blanket etch. The plasma may be sustained by the plasma source for a predetermined period of time, typically in the range of about 10 to 20 minutes. During this time period, the features of the plasma processing tool described above may be used to control parameters such as the substrate table bias power, the plasma power supplied by the coil 9, the pressure inside the plasma processing chamber 2, and the temperature of the wafer 30. Optionally, the substrate table 14 may be biased with a voltage while the plasma is present in the chamber. Hence, in step 207 (which is optional, as signified by dashed lines) a bias is applied to the substrate table 14 with a first power P1 while the plasma source continues to power the plasma. It may be that the same power P1 is maintained for the duration of the etch, but in some preferred implementations, as noted above, the bias power is reduced for a final portion of the etch. Hence, the method may optionally involve reducing the bias power during the optional step 209 to a value that is lower than P1, preferably less than half of P1. For example, typically P1 is in the range of 400 to 1000 W while P2 is in the range of 50 to 200 W. The reduced bias power P2 is preferably sustained for period of time in the range of 1 to 5 minutes, while the total duration of the etch is in the range of 10 to 20 minutes as mentioned above.

Once the etch has been performed for the required amount of time, the plasma may be extinguished in step 211. This can be achieved by evacuating the etch gas mixture from the plasma processing chamber 2 and/or turning off the supply of power to the coil 9 of the plasma source. Optionally, an epitaxial layer 213 may then be grown on the etched surface in step 213. As noted above, this may be performed by transferring the prepared wafer 30 to a chamber for epitaxial growth, which could be a separate chamber provided as part of the same plasma processing tool 1 by which the etch was performed or part of a separate device altogether. It should be noted that this step is not necessarily performed by the same entity and/or at the same apparatus, facility or site as the preceding steps. For example, the wafer 30 may be prepared in accordance with steps 201-211 by a manufacturer of wafers and then shipped to customers who perform the epitaxial growth step 213. Since methods in accordance with the present invention are capable of reducing the surface roughness of an SiC wafer 30 to a value suitable for performing epitaxial growth, there is no need to perform a chemical mechanical polishing step between steps 211 and step 213 (or indeed at any other time). The epitaxial layer be a layer of SiC or any other material of which an epitaxial layer can be formed on an SiC surface. The process could involve forming additional epitaxial layers of the same and/or different materials, which could then be etched to produce devices such as transistors and diodes.

Figure 3A:
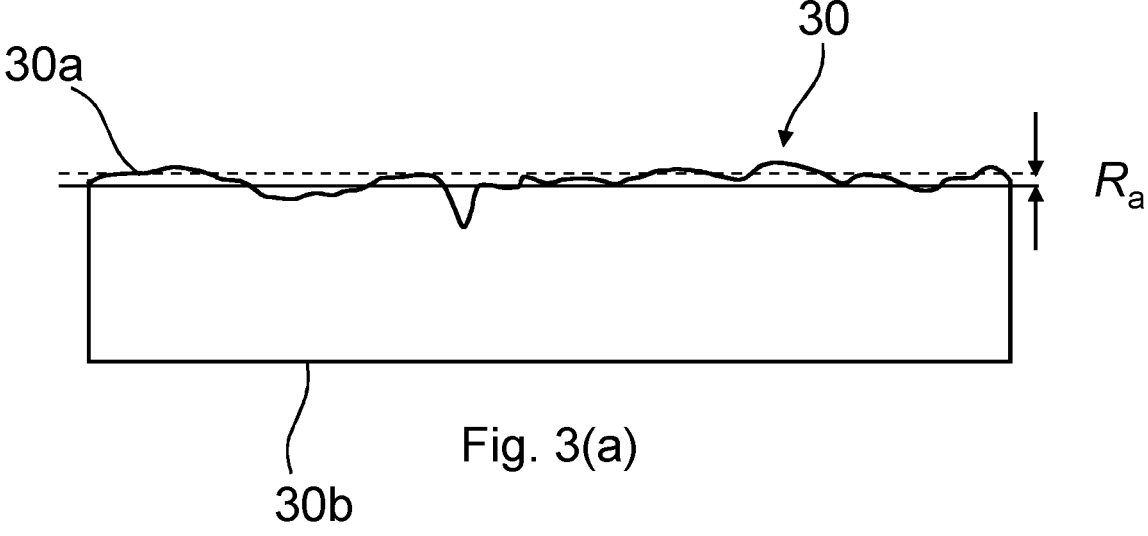
FIGS. 3(a)-(c) show illustrations of a silicon carbide wafer at different stages of preparation and subsequent epitaxial growth in accordance with embodiments of the invention.
Figure 3B:
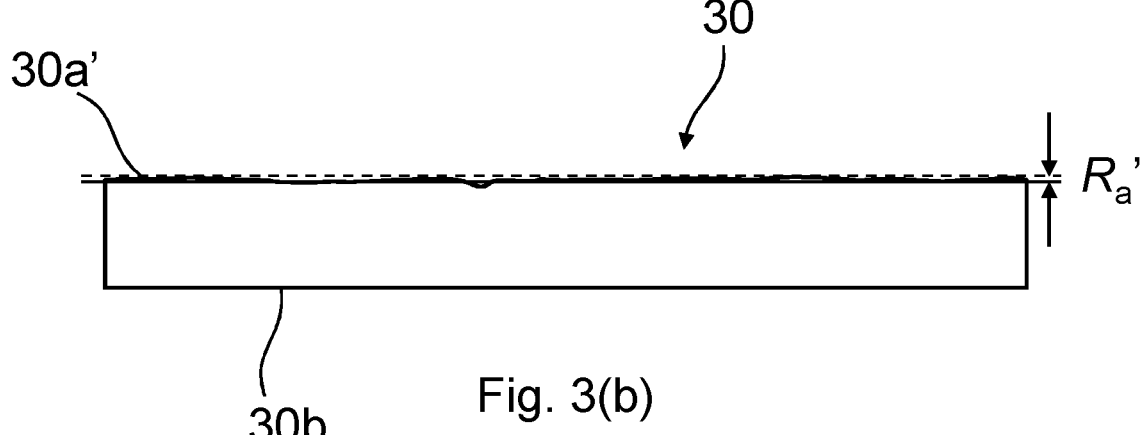
Figure 3C:
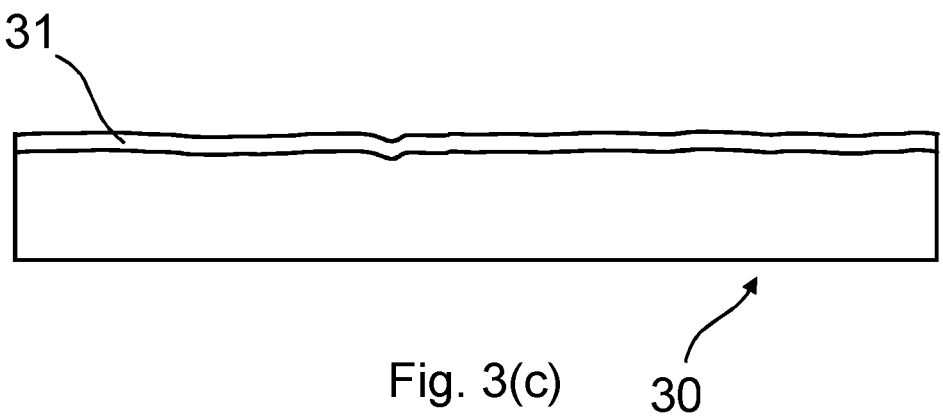

FIGS. 3(*a*) to (*c*) show cross-sectional views of an SiC wafer 30 at various stages of its preparation in accordance with the present invention. FIG. 3(*a*) shows the wafer 30 prior to etching, for example during step 201 of the method of FIG. 2. The surface 30*a* that is to be prepared for epitaxial growth thereon can be seen to have an undulating profile with elevations and depressions (though these are much exaggerated and not to scale with the thickness of the wafer 30), which may be the result of damage caused by the slicing, lapping and polishing of the wafer 30 and/or the presence of defects at the surface 30*a*. The dashed line in this drawing shows the arithmetic average roughness $R_a$ of the surface 30*a*, which is the average deviation of the actual surface profile from a nominal plane of the surface, which is indicated by the solid line. $R_a$ is typically in the range of 1 to 100 nm, preferably 1 to 10 nm, before the wafer is subjected to etching in accordance with the present invention. Furthermore, in some embodiments $R_a$ may be at least 5 nm before the etch is performed. For simplicity, the profile of the surface 30*b* has not been illustrated here, though it will be understood that this surface will typically have a similar roughness provided it has undergone the same processing as the surface 30*a*. Preferably the surface 30*a* that is to be etched is an Si face, i.e. a face that terminates in a layer of Si atoms. This can be achieved simply by ensuring that the plane of the wafer 30 is suitably oriented with respect to the crystallographic axes of the crystal lattice as the crystal is manufactured.

FIG. 3(*b*) shows the wafer 30 after being etched during a method in accordance with the present invention, for example during or after step 211 of the exemplary method of FIG. 2. It can be seen the surface roughness $R_a'$ of the etched surface 30*a'* is considerably less than the initial value $R_a$. As noted above, $R_a'$ is preferably less than 3 nm, more preferably less than 1 nm and still more preferably less than 0.5 nm.

FIG. 3(*c*) shows the wafer 30 after an epitaxial layer 31 has been grown on the etched surface 30*a'*, as is performed in some embodiments of the invention, for example during step 213 in the process of FIG. 2.

We will now present experimental results showing the reductions in surface roughness of SiC wafers achieved by methods in accordance with embodiments of each of the first, second and third aspects of the invention together with the process parameters by which these results were achieved. We will refer to these as processes 1, 2 and 3 respectively. In each process, steps 201, 203 and 205 of the process of FIG. 2 were performed using an SiC wafer 30 for which the arithmetic average roughness of an unmasked surface 30*a* was measured before and after being etched. The SiC wafers 30 that were used were produced by Physical Vapour Transport and had diameters in the range of 100 to 150 nm, and the surfaces 30*a* that were etched included both Si faces and C faces (i.e. faces terminated in Si and C atoms respectively).

The experimental parameters and the results that were obtained are shown in the pairs of tables 1(a) and 1(b), 2(a) and 2(b), and 3(a) and 3(b). Each table lists the flow rates at which the gases in the etch gas mixture were introduced to the plasma processing chamber 2 in standard cubic centimetres per minutes (sccm), the pressure of the plasma inside the plasma processing chamber 2, the power supplied to the coil 9 of the plasma source, the power of the bias applied to the substrate table 14 and the duration of the etch for each process are listed in these tables together with the measured values of the arithmetic average roughness of the unmasked surface 30*a* of the before the etch in step 201, $R_a$, and the arithmetic average roughness of the same surface after the etch at step 211, $R_a'$. In each of processes 1, 2 and 3, helium was supplied to the surface 30*b* of the wafer 30 proximal to the substrate table (in a backside cooling configuration) at a pressure of 2 Torr so as to ensure that the wafer 30 and substrate table 14 did not heat to undesirably high temperatures during the etch. For the exemplary processes 1, 2 and 3, it has been found that the values of the pressure inside the plasma processing chamber 2, the power supplied to the coil 9, the power of the bias applied to the substrate table and the pressure of the helium can each be varied by at least ±20% of the values stated here while still successfully preparing the surface 30*a* of the SiC wafer 30 for epitaxial growth.

Tables 1(a) and 1(b) shows the experimental parameters listed above and the results obtained for two experiments, experiments number 1 and 2, which were each performed in accordance with embodiments of the first aspect of the invention. In one of these processes, an etch gas mixture composed of only $H_2$ and Ar was used, while in the other two, the etch gas mixtures were composed of $H_2$, $SF_6$ and Ar. As noted above, the first aspect of the invention only requires the presence of $H_2$ in the etch gas mixture, though a fluorine-bearing gas such as $SF_6$ and a noble gas such as Ar are both preferred additives.

TABLE 1(a)

| Experiment no. | $H_2$ flow rate (sccm) | $SF_6$ flow rate (sccm) | Ar flow rate (sccm) | Plasma pressure (mTorr) |
|---|---|---|---|---|
| 1 | 150 | 0 | 50 | 20 |
| 2 | 200 | 5 | 50 | 5 |

TABLE 1(b)

| Experiment no. | Plasma source power (W) | Substrate table bias power (W) | Etch duration (minutes) | $R_a$ (nm) | $R_a'$ (nm) |
|---|---|---|---|---|---|
| 1 | 3000 | 400 | 20 | 1.13 | 0.70 |
| 2 | 2500 | 1000 | 20 | 1.1 | 0.41 |

Tables 2(a) and 2(b) show the experimental parameters listed above and the results obtained for two experiments, experiments number 3 and 4, which were performed in accordance with embodiments of the second aspect of the invention. The etch gas mixtures used in these processes were composed of $CHF_3$ and $SF_6$. In these exemplary processes, only one hydrofluorocarbon and one fluorine-bearing gas were present in the etch gas mixture. However, any number of other fluorocarbons and/or hydrofluorocarbons could be provided as alternatives or in addition to the $CHF_3$ that was chosen for this implementation. Other fluorine-bearing gasses besides $SF_6$ could also be utilised.

TABLE 2(a)

| Experiment no. | $CHF_3$ flow rate (sccm) | $SF_6$ flow rate (sccm) | Plasma pressure (mTorr) |
|---|---|---|---|
| 3 | 10 | 70 | 3 |
| 4 | 10 | 70 | 3 |

TABLE 2(b)

| Experiment no. | Plasma source power (W) | Substrate table bias power (W) | Etch duration (minutes) | $R_a$ (nm) | $R_a'$ (nm) |
|---|---|---|---|---|---|
| 3 | 3200 | 800 | 10 | 6.22 | 2.44 |
| 4 | 3200 | 1000 | 10 | 1.3 | 0.8 |

Tables 3(a) and 3(b) show the experimental parameters listed above and the results obtained for three experiments, experiments 5 and 6, which were performed in accordance with embodiments of the third aspect of the invention. The etch gas mixtures used in these processes were composed of HBr, $O_2$ and $SF_6$. As noted above, the only essential components of the etch gas mixture for performing the third aspect of the invention are HBr and $O_2$, though the presence of a fluorine bearing-gas such as $SF_6$ is preferred.

TABLE 3(a)

| Experiment no. | HBr flow rate (sccm) | $O_2$ flow rate (sccm) | $SF_6$ flow rate (sccm) | Plasma pressure (mTorr) |
|---|---|---|---|---|
| 5 | 60 | 40 | 10 | 15 |
| 6 | 80 | 20 | 20 | 20 |

TABLE 3(b)

| Experiment no. | Plasma source power (W) | Substrate table bias power (W) | Etch duration (minutes) | $R_a$ (nm) | $R_a'$ (nm) |
|---|---|---|---|---|---|
| 5 | 3000 | 400 | 10 | 8.50 | 1.54 |
| 6 | 2500 | 200 | 10 | 4.76 | 0.76 |

It can be seen that each of the exemplary processes used to conduct experiments 1-6 reduced the surface roughness of the etched surface 30a to values suitable for epitaxial growth and hence successfully prepared the surface 30a for subsequent epitaxial growth thereon.

The invention claimed is:

1. A method of preparing a silicon carbide wafer for subsequent epitaxial growth thereon, the method comprising:
   in a plasma processing chamber containing a silicon carbide wafer mounted on a support table such that the surface of the silicon carbide wafer distal to the support table is unmasked:
      establishing a flow of an etch gas mixture into the plasma processing chamber, wherein the etch gas mixture comprises molecular hydrogen, $H_2$, and a noble gas, wherein the ratio of $H_2$ to the noble gas in the etch gas mixture is in the range of 5:1 to 1.5:1; and
      generating a plasma from the etch gas mixture within the plasma processing chamber and using the plasma to etch the unmasked surface of the wafer so as to reduce the roughness of the unmasked surface.

2. The method of claim 1, wherein the noble gas has an atomic weight greater than 28.

3. The method of claim 1, wherein 5% to 40% of the etch gas mixture consists of the noble gas.

4. The method of claim 1, wherein the etch gas mixture further comprises one or more fluorine-bearing gases, each of the one or more fluorine-bearing gases configured to release fluorine radicals when in the plasma.

5. The method of claim 4, wherein the ratio of $H_2$ to the one or more fluorine-bearing gases in the etch gas mixture is in the range of 100:1 to 5:1.

6. The method of claim 1, wherein at least 20% of the etch gas mixture consists of $H_2$.

7. The method of claim 1, wherein the wafer is oriented such that the unmasked surface is a silicon face.

8. The method of claim 1, further comprising, during the etching, delivering helium to the surface of the wafer proximal to the substrate table to cool the wafer.

9. The method of claim 1, further comprising, during etching:
   applying a bias voltage to the substrate table with a first power, P1, for a first time period; and then
   applying the bias voltage to the substrate table with a second power, P2, for a second time period,
      wherein the noble gas has an atomic weight wherein P2 is less than P1.

10. A method of preparing a silicon carbide wafer for subsequent epitaxial growth thereon, the method comprising:
   in a plasma processing chamber containing a silicon carbide wafer mounted on a support table such that the surface of the silicon carbide wafer distal to the support table is unmasked:
      establishing a flow of an etch gas mixture into the plasma processing chamber, wherein the etch gas mixture comprises:
         (i) one or more fluorine-bearing gases configured to release fluorine radicals when in a plasma; and
         (ii) one or more polymer-forming fluorocarbons and/or one or more polymer-forming hydrofluorocarbons; and
      generating a plasma from the etch gas mixture within the plasma processing chamber and using the plasma to etch the unmasked surface of the wafer so as to reduce the roughness of the unmasked surface.

11. The method of claim 10, wherein the one or more fluorine-bearing gases comprise one or more of sulphur hexafluoride, $SF_6$, carbon tetrafluoride, $CF_4$, nitrogen trifluoride, $NF_3$, and molecular fluorine, $F_2$.

12. The method of claim 10, wherein the one or more polymer-forming fluorocarbons comprise octafluorocyclobutane, c-$C_4F_8$, and/or the one or more polymer-forming hydrofluorocarbons comprise trifluoromethane, $CHF_3$.

13. The method of claim 10, wherein the ratio of the one or more fluorine-bearing gases to the polymer-forming fluorocarbons and/or polymer-forming hydrofluorocarbons in the etch gas mixture is in the range of 15:1 to 3:1.

14. The method of claim 10, wherein at least 90% of the etch gas mixture consists of the one or more fluorine-bearing gases and the one or more polymer-forming fluorocarbons and/or polymer-forming hydrofluorocarbons.

15. A method of preparing a silicon carbide wafer for subsequent epitaxial growth thereon, the method comprising:

in a plasma processing chamber containing a silicon carbide wafer mounted on a support table such that the surface of the silicon carbide wafer distal to the support table is unmasked:

establishing a flow of an etch gas mixture into the plasma processing chamber, wherein the etch gas mixture comprises hydrogen bromide, HBr, and oxygen, $O_2$; and generating a plasma from the etch gas mixture within the plasma processing chamber and using the plasma to etch the unmasked surface of the wafer so as to reduce the roughness of the unmasked surface, wherein, during the etching, helium is delivered to the surface of the wafer proximal to the substrate table to cool the wafer.

16. The method of claim 15, wherein:

at least 40% of the etch gas mixture consists of HBr; and/or the ratio of HBr:$O_2$ in the etch gas mixture is in the range of 3:1 to 1.5:1.

17. The method of claim 15, wherein the etch gas mixture further comprises one or more halogen-bearing gases that do not comprise bromine.

18. The method of claim 17, wherein the one or more halogen-bearing gases comprise one or more fluorine-bearing gases each configured to release fluorine radicals when in the plasma.

19. The method of claim 18, wherein the ratio of HBr to the one or more fluorine-bearing gases in the etch gas mixture is in the range of 100:1 to 2:1.

* * * * *